(12) United States Patent
Kim et al.

(10) Patent No.: US 10,864,706 B2
(45) Date of Patent: Dec. 15, 2020

(54) ENCAPSULATION FILM

(71) Applicant: LG CHEM, LTD., Seoul (KR)

(72) Inventors: Hyun Suk Kim, Daejeon (KR); Hyun Jee Yoo, Daejeon (KR); Jung Ok Moon, Daejeon (KR); Jung Woo Lee, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 165 days.

(21) Appl. No.: 16/082,508

(22) PCT Filed: Mar. 13, 2017

(86) PCT No.: PCT/KR2017/002689
§ 371 (c)(1),
(2) Date: Sep. 5, 2018

(87) PCT Pub. No.: WO2017/155367
PCT Pub. Date: Sep. 14, 2017

(65) Prior Publication Data
US 2019/0077120 A1    Mar. 14, 2019

(30) Foreign Application Priority Data

Mar. 11, 2016 (KR) .......... 10-2016-0029506

(51) Int. Cl.
*B32B 15/08* (2006.01)
*B32B 27/18* (2006.01)
*B32B 15/085* (2006.01)
*C08J 5/18* (2006.01)
*H01L 51/52* (2006.01)
(Continued)

(52) U.S. Cl.
CPC ............ *B32B 15/085* (2013.01); *B32B 15/08* (2013.01); *B32B 27/18* (2013.01); *C08J 5/18* (2013.01); *H01L 51/5203* (2013.01); *H01L 51/5243* (2013.01); *H01L 51/56* (2013.01); *B32B 15/088* (2013.01); *B32B 15/092* (2013.01);
(Continued)

(58) Field of Classification Search
CPC ............................... B32B 15/20; B32B 15/08
See application file for complete search history.

(56) References Cited

U.S. PATENT DOCUMENTS 10,103,352 B2 * 10/2018 Yoo ...................... H01L 51/004
10,135,022 B2   11/2018 Yoo et al.
(Continued)

FOREIGN PATENT DOCUMENTS

CN    105247699 A    1/2016
CN    105340102 A    2/2016
(Continued)

*Primary Examiner* — Rip A Lee
(74) *Attorney, Agent, or Firm* — Dentons US LLP

(57) ABSTRACT

The present application relates to an encapsulating film, a reliability assessment therefor, an organic electronic apparatus comprising the encapsulating film, and a method for producing an organic electronic apparatus which has used the encapsulating film, and provides: a reliability assessment method which can predict the reliability of the encapsulating film before same is applied to the organic electronic apparatus, the encapsulating film blocking moisture or oxygen from the outside entering the organic electronic apparatus; and the encapsulating film which can block moisture with high reliability.

17 Claims, 1 Drawing Sheet

(51) Int. Cl.
*H01L 51/56* (2006.01)
*B32B 15/088* (2006.01)
*B32B 15/092* (2006.01)

(52) U.S. Cl.
CPC ........ *C08J 2323/22* (2013.01); *C08J 2491/00* (2013.01); *H01L 51/5259* (2013.01)

(56) References Cited

U.S. PATENT DOCUMENTS

| | | | |
|---|---|---|---|
| 10,403,850 B2 * | 9/2019 | Yoo | H01L 51/56 |
| 2018/0122874 A1 * | 5/2018 | Kim | H01L 27/3213 |

FOREIGN PATENT DOCUMENTS

| | | | | |
|---|---|---|---|---|
| CN | 105358963 A | 2/2016 | | |
| CN | 105377966 A | 3/2016 | | |
| JP | 2013-232279 A | 11/2013 | | |
| JP | 2015-099367 A | 5/2015 | | |
| KR | 10-1271413 B1 | 6/2013 | | |
| KR | 10-2014-0064395 A | 5/2014 | | |
| KR | 10-2014-0138553 A | 12/2014 | | |
| KR | 10-2015-0059667 A | 6/2015 | | |
| KR | 10-2015-0097434 A | 8/2015 | | |
| KR | 10-2015-0097435 A | 8/2015 | | |
| TW | 201544572 A | 12/2015 | | |
| WO | WO 2014/189293 A1 * | 11/2014 | ............. | H01L 51/52 |
| WO | 2015/126172 A1 | 8/2015 | | |
| WO | 2015/147600 A1 | 10/2015 | | |
| WO | WO 2014/189292 A1 * | 11/2017 | ............. | H01L 51/52 |

\* cited by examiner

[Figure 1]
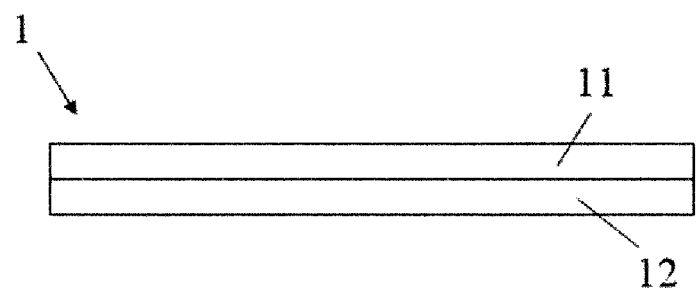
[Figure 2]
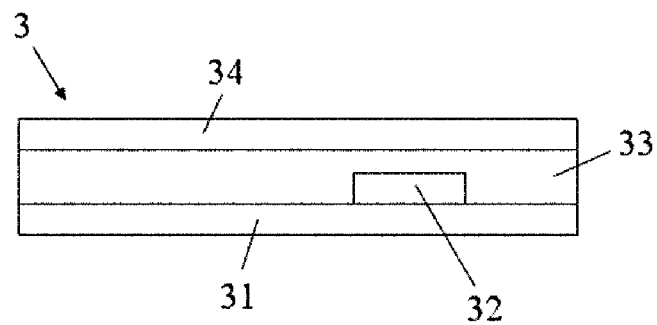
[Figure 3]
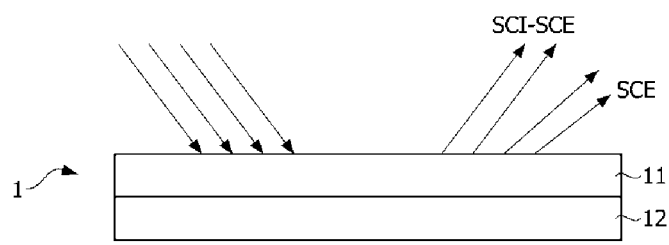

ENCAPSULATION FILM

CROSS-REFERENCE TO RELATED APPLICATIONS

This application is a National Stage Application of International Application No. PCT/KR2017/002689 filed Mar. 13, 2017, and claims the benefit of Korean Patent Application No. 10-2016-0029506 filed Mar. 11, 2016, all of which are hereby incorporated by reference in their entirety for all purposes as if fully set forth herein.

TECHNICAL FIELD

The present invention relates to an encapsulation film, a reliability evaluation method thereof, an organic electronic device comprising the same, and a method of manufacturing an organic electronic device using the same.

BACKGROUND ART

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the most important problem is a durability problem. Organic materials and metal electrodes, and the like contained in the OLED are very easily oxidized by external factors such as moisture. In order to solve the above problem, an encapsulation film for blocking moisture is applied to an organic electronic device.

However, before the encapsulation film for blocking moisture is applied to the organic electronic device, performance verification must be preceded, but in the case of an encapsulation film in which a metal layer has been integrated, there is a problem that the performance verification is difficult.

DISCLOSURE

Technical Problem

The present application provides a reliability evaluation method capable of predicting reliability for an encapsulation film, before the encapsulation film for blocking moisture or oxygen introduced from the outside into an organic electronic device is applied to the organic electronic device and an encapsulation film having excellent reliability for moisture blocking performance.

Technical Solution

The present invention relates to an encapsulation film and a reliability evaluation method of the encapsulation film. The encapsulation film can be applied to sealing or encapsulating organic electronic devices such as, for example, OLEDs. In this specification, the term "reliability" may mean reliability for moisture blocking performance of an encapsulation film.

In this specification, the term "organic electronic device" means an article or device having a structure comprising an organic material layer that generates alternate current of charges using holes and electrons between a pair of electrodes facing each other, and an example thereof may include, but is not limited to, a photovoltaic device, a rectifier, a transmitter and an organic light emitting diode (OLED), and the like. In one example of the present invention, the organic electronic device may be an OLED.

An exemplary encapsulation film may comprise a metal layer and an encapsulation layer formed on the metal layer. The encapsulation layer may comprise a moisture adsorbent. In one example, the reliability evaluation method of the encapsulation film may comprise for the encapsulation film to have a specular reflectance R, according to Equation 1 below to the encapsulation layer at a wavelength of 550 nm, of 6.5 or less. That is, it can be determined by the evaluation method of the present application that the encapsulation film having a specular reflectance R in the range of 6.5 or less has excellent reliability. The measurement of the specular reflectance can be performed by irradiating the encapsulation layer formed on the metal layer with light having a wavelength of 550 nm, as shown in FIG. 3. In one example, the encapsulation film may have a region having a specular reflectance R, according to the Equation 1 below at a wavelength of 550 nm, of 6.5 or less.

$$R = SCI - SCE, \quad \text{(Formula 1)}$$

in Equation 1 above, SCI is a total reflectance (Specular Component Included, SCI) including normal reflection measured according to ASTM E1164-12E1, and SCE means a reflectance (Specular Component Excluded, SCE) excluding normal reflection measured according to ASTM E1164-12E1. Specifically, SCI means a total reflectance, and SCE means an irregular reflectance by scattering. The reflectance may be measured by methods known in the art, and for example, may be measured using CM2006d from Konika Minolta (measuring conditions: any one set value of M/I+E, M/SCI, M/SCE, S/I+E, S/SCI and S/SCE, any one set value of UV 0% to 100%, any one light source of D65, D50, C, A, F2, F6, F7, F8, F10, F11 and F12, an observing visual field of 10° or 2°).

The present application can provide a highly reliable film as a moisture barrier film by controlling the specular reflectance of the encapsulation film to 6.5 or less, 6.3 or less, 6.0 or less, or 5.9 or less. In general, a moisture adsorbent which is comprised in a film may reduce scattering by generating a hydrate by hydration reaction with moisture penetrated into the film and thus causing downsizing of an effective moisture adsorbent aggregate capable of reacting with moisture. In addition, by the refractive index change of the moisture adsorbent due to the hydration reaction, a refractive index match with the resin (that is, the refractive index converges similarly) may be achieved to result in decrease of scattering. Therefore, the reliability of the film can be measured by only haze measurement according to the presence or absence of scattering. However, when the encapsulation layer and the metal layer are integrally provided as in the present application, it is difficult to verify the reliability by simply measuring only the haze according to the presence or absence of transparency due to the metal layer. Therefore, the present application can achieve convenience of the process by providing the metal layer and the encapsulation layer integrally, and simultaneously provide a highly reliable film by measuring the specular reflectance as in Equation 1.

In an embodiment of the present application, the encapsulation resin of the present invention to be described below may have a refractive index in a range of 1.3 to 1.6. The moisture adsorbent may have a refractive index in the range of 1.6 to 2.5. The refractive index of the encapsulation resin may be lower than the refractive index of the moisture adsorbent. The refractive index may be measured using an Abbe refractometer.

In one example, the reliability evaluation method of the encapsulation film may comprise for the encapsulation film to have a specular reflectance ratio r according to Equation 2 below of 0.5 or less, 0.3 or less, 0.151 or less, 0.150 or less, or 0.147 or less. It can be determined by the reliability evaluation method of the present application that the encapsulation film having the specular reflectance ratio in the above range has an excellent moisture blocking performance.

$$r=(SCI-SCE)/SCI \quad \text{(Equation 2)}$$

In Equation 2 above, SCI is a total reflectance including normal reflection measured according to ASTM E1164-12E1, and SCE means a reflectance excluding normal reflection measured according to ASTM E1164-12E1. Here, the specular reflectance ratio means a ratio of the specular reflectance to the total reflectance. The encapsulation film having the specular reflectance ratio of 0.5 or less may be one having less functional loss of the moisture adsorbent. In the case of the encapsulation film, the function of the moisture adsorbent existing in the encapsulation film may be lost by absorbing moisture in the air during the distribution and storage before being applied to the organic electronic device. The present application provides a film that such a functional loss is minimized. In one example, the encapsulation layer may have a thickness in a range of 15 μm to 70 μm. The present application can improve coating properties by controlling the thickness of the encapsulation layer to 15 μm or more, and improve workability by controlling the thickness to 70 μm or less to shorten the drying time. In addition, the metal layer may have a thickness in a range of 20 μm to 150 μm. The present application can improve moisture barrier property by controlling the thickness of the metal layer to 20 μm or more, and improve cutting processability by controlling the thickness to 150 μm or less.

In an embodiment of the present application, the metal layer may be a thin metal foil or a polymer base layer deposited with metal. As the metal layer, a material having thermal conductivity and moisture barrier properties can be used without limitation. The metal layer may comprise any one of a metal, a metal oxide, a metal nitride, a metal carbide, a metal oxynitride, a metal oxyboride and a combination thereof. For example, the metal layer may comprise an alloy in which one or more metal elements or non-metal elements are added to one metal, and may comprise, for example, an iron-nickel alloy or stainless steel (SUS). In addition, in one example, the metal layer may comprise copper, aluminum, nickel, silicon oxide, aluminum oxide, titanium oxide, indium oxide, tin oxide, indium tin oxide, tantalum oxide, zirconium oxide, niobium oxide and a combination thereof. The metal layer may be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present invention, the metal layer may be deposited by reactive sputtering.

Preferably, the metal layer may have a thermal conductivity of 50 W/mK or more, 60 W/mK or more, 70 W/mK or more, 80 W/mK or more, 90 W/mK or more, 100 W/mK or more, 110 W/MK or more, 120 W/MK or more, 130 W/MK or more, 140 W/mK or more, 150 W/mK or more, 200 W/mK or more, or 250 W/mK or more. By having such a high thermal conductivity, the heat generated at the bonding interface during the metal layer bonding process can be released more quickly. Also, the high thermal conductivity rapidly releases the heat accumulated during the operation of the organic electronic device to the outside, whereby the temperature of the organic electronic device itself can be maintained lower, and the occurrence of cracks and defects is reduced.

The term "thermal conductivity" herein is a degree representing capability in which a material is capable of transferring heat by conduction, where the unit may be expressed by W/mK. The unit represents the degree to which the material transfers heat at the same temperature and distance, which means a unit of heat (watt) to a unit of distance (meter) and a unit of temperature (Kelvin).

In one example, the reflectance of the metal layer may be 50% to 80%, 53% to 77%, or 55% to 75% in the Specular Component Included (SCI) measurement measured according to ASTM E1164-12E1. In addition, the reflectance of the metal layer may be 5% to 35%, 8% to 33%, or 10% to 30% in the Specular Component Excluded (SCE) measurement measured according to ASTM E1164-12E1. Here, the reflectance of the metal layer to be measured may be a reflectance to the metal layer surface where the encapsulation layer is not present. By controlling the reflectance of the metal layer within the above range, the present application can evaluate and provide a highly reliable film through the specular reflectance of the film according to the aforementioned Equation 1.

In an embodiment of the present application, the encapsulation layer may comprise a pressure-sensitive adhesive composition or an adhesive composition, and in one example, the encapsulation layer may comprise an encapsulation resin. In one example, the encapsulation layer may be a single layered or two or more multi-layered structure. When two or more layers compose the encapsulation layer, the composition of each layer in the encapsulation layer may be the same or different. In one example, the encapsulation layer may be a pressure-sensitive adhesive layer or an adhesive layer.

The encapsulation layer may comprise an encapsulation resin. In one example, the encapsulation resin may comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

Here, as the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high density polyethylene resin or elastomer, a low density polyethylene resin or elastomer, a polypropylene resin or elastomer or a mixture thereof can be exemplified. As the elastomer, for example, an ester thermoplastic elastomer, an olefin elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth) acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-comprising cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above may be also used, for example, by being grafted with maleic anhydride or the like, by being copolymerized with other resins or elastomers through monomers for producing resins or elastomers, and by being modified with other compounds. An example of other compounds above may include carboxyl-terminal butadiene-acrylonitrile copolymers and the like.

In one example, the encapsulation layer may comprise, but is not limited to, the olefin elastomer, the silicone elastomer or the acrylic elastomer, and the like among the above-mentioned types as the encapsulation resin.

In one embodiment of the present application, the encapsulation resin may be an olefin resin. In one example, the olefin resin may be a homopolymer, or a copolymer of a diene and an olefin compound comprising one carbon-carbon double bond. Here, the olefin compound may include isobutylene, propylene or ethylene, and the like, and the diene may be a monomer capable of polymerizing with the olefin compound, and for example, include 1-butene, 2-butene, isoprene or butadiene, and the like. That is, as the encapsulation resin of the present application, for example, a homopolymer of an isobutylene monomer; a copolymer obtained by copolymerizing an isobutylene monomer and other polymerizable monomers; or a mixture thereof may be used. In one example, the copolymer of an olefin compound comprising one carbon-carbon double bond and a diene may be butyl rubber. By using a specific resin as above, it is possible to satisfy the moisture barrier property to be implemented in the present invention. In addition, the present application can improve moisture resistance and heat resistance by implementing a specific cross-linking structure in the encapsulation layer because the existing isobutylene polymer has low moisture permeability but low heat resistance.

In the encapsulation layer, the resin or elastomer component may have a weight average molecular weight (Mw) to an extent such that the pressure-sensitive adhesive composition can be formed into a film shape. For example, the resin or elastomer may have a weight average molecular weight of about 90,000 to 2,000,000, 100,000 to 1,500,000, or 150,000 to 1,000,000 or so. The term weight average molecular weight herein means a value converted to standard polystyrene measured by GPC (Gel Permeation Chromatograph). However, the resin or elastomer does not necessarily have the above-mentioned weight average molecular weight. For example, in the case where the molecular weight of the resin or elastomer component is not in a level enough to form a film, a separate binder resin may be blended into the pressure-sensitive adhesive composition.

In another embodiment, the encapsulation resin according to the present application may be a curable resin. The specific kind of the curable resin that can be used in the present application is not particularly limited, and for example, various thermosetting or photo-curable resins known in this field can be used. The term "thermosetting resin" means a resin that can be cured through an appropriate heat application or aging process, and the term "photo-curable resin" means a resin that can be cured by irradiation of electromagnetic waves. Furthermore, the curable resin may be a dual curable resin including both thermosetting and photo curing characteristics.

The specific kind of the curable resin in the present application is not particularly limited as long as it has the above-mentioned characteristics. For example, those which may be cured to exhibit an adhesive property may include a resin comprising one or more thermally curable functional groups such as a glycidyl group, an isocyanate group, a hydroxy group, a carboxyl group or an amide group, or one or more functional groups capable of being cured by irradiation of an electromagnetic wave such as an epoxide group, a cyclic ether group, a sulfide group, an acetal group or a lactone group. The specific kind of the resin as above may include an acrylic resin, a polyester resin, an isocyanate resin or an epoxy resin, and the like, but is not limited thereto.

In the present application, as the curable resin, aromatic or aliphatic; or linear or branched epoxy resins may be used. In one embodiment of the present application, an epoxy resin having an epoxy equivalent of 180 g/eq to 1,000 g/eq, which contains two or more functional groups, may be used. By using the epoxy resin having an epoxy equivalent in the above range, characteristics such as adhesion performance and glass transition temperature of the cured product can be effectively maintained. An example of such an epoxy resin may include one or a mixture of two or more of a cresol novolac epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In the present application, as the curable resin, an epoxy resin comprising a cyclic structure in a molecular structure can be used, and an epoxy resin comprising an aromatic group (e.g., a phenyl group) can be used. When the epoxy resin comprises an aromatic group, the cured product has excellent thermal and chemical stability and simultaneously exhibits a low moisture absorption amount, whereby the reliability of the organic electronic device encapsulation structure can be improved. A specific example of the aromatic group-containing epoxy resin that can be used in the present application may be one or a mixture of two or more of a biphenyl type epoxy resin, a dicyclopentadiene type epoxy resin, a naphthalene type epoxy resin, a dicyclopentadiene-modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin, but is not limited thereto.

In the present application, as the epoxy resin, a silane-modified epoxy resin or a silane-modified epoxy resin having an aromatic group can be also used. When the epoxy resin having a silane group structurally by being modified with silane as such is used, it is possible to maximize adhesiveness with the glass substrate or the substrate inorganic materials of the organic electronic device, and to improve moisture barrier property or durability and reliability. The specific kind of the epoxy resin as above which can be used in the present application is not particularly limited, and such a resin can be easily obtained from a purchase place such as, for example, Kukdo Chemical Co., Ltd.

In addition, the encapsulation layer of the present application may comprise an active energy ray polymerizable compound which is highly compatible with the encapsulation resin and can form a specific cross-linked structure together with the encapsulation resin.

For example, the encapsulation layer of the present application may comprise a multifunctional active energy ray polymerizable compound that can be polymerized by irradiation of an active energy ray together with an encapsulation resin. The active energy ray polymerizable compound may mean a compound having two or more functional groups capable of participating in polymerization reaction by irradiation of an active energy ray, for example, functional groups comprising an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) can be used.

Furthermore, the multifunctional active energy ray polymerizable compound which can be polymerized by irradiation of the active energy ray may satisfy Formula 1 below. Also, the active energy ray polymerizable compound may be comprised in an amount of 5 to 30 parts by weight, 5 to 25 parts by weight, 8 to 20 parts by weight, 10 to 18 parts by weight or 12 to 18 parts by weight relative to 100 parts by weight of the encapsulation resin.

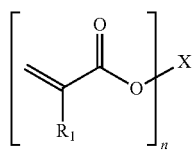

(Formula 1)

In Formula 1 above, $R_1$ is hydrogen or an alkyl group having 1 to 4 carbon atoms, n is an integer of 2 or more, and X represents a residue derived from a linear, branched or cyclic alkyl group having 3 to 30 carbon atoms. Here, when X is a residue derived from a cyclic alkyl group, X may be, for example, a residue derived from a cyclic alkyl group having 3 to 30 carbon atoms, 6 to 28 carbon atoms, 8 to 22 carbon atoms or 12 to 20 carbon atoms. In addition, when X is a residue derived from a linear alkyl group, X may be a residue derived from a linear alkyl group having 3 to 30 carbon atoms, 6 to 25 carbon atoms or 8 to 20 carbon atoms. Furthermore, when X is a residue derived from a branched alkyl group, X may be a residue derived from a branched alkyl group having 3 to 30 carbon atoms, 5 to 25 carbon atoms, or 6 to 20 carbon atoms.

In this specification, the term "residue derived from an alkyl group" may mean one consisting of an alkyl group as a residue of a certain compound. In one example, when n in Formula 1 above is 2, the X may be an alkylene group. In addition, when n is 3 or more, X may be bonded to the (meth) acroyl group of Formula 1 above by eliminating two or more hydrogen atoms of the alkyl group. n may be from 2 to 20.

The term "alkyl group" herein may mean an alkyl group having 1 to 30 carbon atoms, 1 to 25 carbon atoms, 1 to 20 carbon atoms, 1 to 16 carbon atoms, 1 to 12 carbon atoms, 1 to 8 carbon atoms or 1 to 4 carbon atoms, unless otherwise specified. The alkyl group may have a linear, branched or cyclic structure and may optionally be substituted with one or more substituents.

The term "alkylene group" herein may mean an alkylene group having 2 to 30 carbon atoms, 2 to 25 carbon atoms, 2 to 20 carbon atoms, 2 to 16 carbon atoms, 2 to 12 carbon atoms, 2 to 10 carbon atoms or 2 to 8 carbon atoms, unless otherwise specified. The alkylene group may have a linear, branched or cyclic structure and may optionally be substituted with one or more substituents.

The term "alkoxy group" herein may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be linear, branched or cyclic. In addition, the alkoxy group may be optionally substituted with one or more substituents.

The multifunctional active energy ray polymerizable compound which can be polymerized by irradiation of the active energy ray can be used without limitation as long as it satisfies Formula 1 above. For example, the compound may include 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-diol di(meth)acrylate, tricyclodecanedimethanol (meth)diacrylate, dimethyloldicyclopentane di(meth)acrylate, neopentylglycol-modified trimethylol propane di(meth)acrylate, admantane di(meth)acrylate, trimethylolpropane tri(meth)acrylate, or a mixture thereof.

As the multifunctional active energy ray polymerizable compound, for example, a compound having a molecular weight of less than 1,000 and comprising two or more functional groups can be used. In this case, the molecular weight may mean a weight average molecular weight or a typical molecular weight. The ring structure included in the multifunctional active energy ray polymerizable compound may be any one of a carbocyclic structure or a heterocyclic structure; or a monocyclic or polycyclic structure.

In an embodiment of the present application, the encapsulation layer may further comprise a monofunctional acrylate. The monofunctional acrylate may include, for example, n-octyl acrylate, iso-octyl acrylate, iso-nonyl acrylate, lauryl acrylate, stearyl acrylate, isostearyl acrylate, isodecyl acrylate, 2-(2-ethoxyethoxy)ethyl acrylate, methoxytriethyleneglycol acrylate, or methoxypolyethyleneglycol acrylate.

In an embodiment of the present application, the encapsulation layer may further comprise a radical initiator. The radical initiator may be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The radical initiator may be included in a ratio of 0.2 to 20 parts by weight, 0.5 to 18 parts by weight, 1 to 15 parts by weight, or 2 to 13 parts by weight, relative to 100 parts by weight of the active energy ray polymerizable compound. As a result, the reaction of the active energy ray polymerizable compound can be effectively induced and deterioration of the physical properties of the pressure-sensitive adhesive composition due to the residual components after curing can be also prevented.

In an embodiment of the present application, the encapsulation layer of the encapsulation film may further comprise a curing agent depending on the kind of the encapsulation resin. For example, it may further comprise a curing agent capable of reacting with the above-mentioned encapsulation resin to form a cross-linked structure or the like.

The kind of the curing agent may be appropriately selected and used depending on the type of the encapsulation resin or the functional group contained in the resin.

In one example, when the encapsulation resin is an epoxy resin, the curing agent is a curing agent of the epoxy resin known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

The content of the curing agent may be selected depending on composition of the composition, for example, the type or ratio of the encapsulation resin. For example, the curing agent may be comprised in an amount of 1 to 20 parts by weight, 1 to 10 parts by weight or 1 to 5 parts by weight, relative to 100 parts by weight of the encapsulation resin. However, the weight ratio can be changed depending on the type and ratio of the encapsulation resin or the functional group of the resin, or the cross-linking density to be implemented, and the like.

When the encapsulation resin is a resin which can be cured by irradiation of the active energy ray, for example, a cationic photopolymerization initiator may be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, as the cationic initiator, an ionized cationic photopolymerization initiator may be used.

In one example, the encapsulation layer may further comprise a tackifier, where the tackifier may be, preferably, a hydrogenated cyclic olefin polymer. As the tackifier, for example, a hydrogenated petroleum resin obtained by hydrogenating a petroleum resin can be used. The hydrogenated petroleum resin may be partially or fully hydrogenated and may be also a mixture of such resins. Such a tackifier can be selected to have good compatibility with the pressure-sensitive adhesive composition, excellent moisture barrier property, and low organic volatile components. A specific example of the hydrogenated petroleum resin may include a hydrogenated terpene resin, a hydrogenated ester resin or a hydrogenated dicyclopentadiene resin, and the like. The tackifier may have a weight average molecular weight of about 200 to 5,000. The content of the tackifier can be appropriately adjusted as necessary. For example, the content of the tackifier may be selected in consideration of the gel content to be described below, and the like. According to one example, it can be included in a ratio of 5 to 100 parts by weight, 8 to 95 parts by weight, 10 to 93 parts by weight or 15 to 90 parts by weight, relative to 100 parts by weight of the solid content.

The encapsulation layer may further comprise a moisture adsorbent, as described above. The term "moisture adsorbent (moisture absorbent)" may mean, for example, a material that can remove moisture or humidity penetrated into the encapsulation film through chemical reaction with the moisture or humidity. When the encapsulation layer of the present application comprises a moisture adsorbent, excellent moisture barrier properties can be realized. Specifically, the encapsulation layer can be applied to encapsulating an organic electronic device when formed into a film. In this case, it comprises a moisture adsorbent to exhibit an excellent moisture barrier property, whereby it can be applied to encapsulation of a bottom emission type organic electronic device, without being limited thereto.

For example, the moisture adsorbent may be present in a state evenly dispersed in the encapsulation layer or the encapsulation film. Here, the evenly dispersed state may mean a state in which the moisture adsorbent is present at the same or substantially the same density even in any part of the encapsulation layer or the encapsulation film. The moisture adsorbent which can be used in the above may be a moisture-reactive adsorbent, and for example, may include a metal oxide, a sulfate or an organic metal oxide, and the like. Specifically, an example of the sulfate may include magnesium sulfate, sodium sulfate or nickel sulfate, and the like, and an example of the organic metal oxide may include aluminum oxide octylate and the like. Here, a specific example of the metal oxide may include phosphorus pentoxide ($P_2O_5$), lithium oxide ($Li_2O$), sodium oxide ($Na_2O$), barium oxide (BaO), calcium oxide (CaO) or magnesium oxide (MgO), and the like, and an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be included in the encapsulation layer, one or two or more of the above-mentioned constitutions may be also used. In one example, when two or more are used as the moisture adsorbent, calcined dolomite and the like may be used.

Such a moisture adsorbent can be controlled to an appropriate size depending on applications. In one example, the average diameter of the moisture adsorbent may be controlled to be 0.5 μm to 5 μm, 1 μm to 4 μm, or 2 μm to 3.5 μm. The moisture adsorbent having a size within the above range has a reaction rate with moisture which is not too fast and thus is easy to store, and may effectively remove moisture, without damaging the element to be sealed.

The content of the moisture adsorbent is not particularly limited and may be appropriately selected in consideration of the desired blocking characteristics. For example, the moisture adsorbent may be included in an amount of 5 to 100 parts by weight, 10 to 90 parts by weight or 15 to 80 parts by weight, relative to 100 parts by weight of the encapsulation resin.

The encapsulation layer may also comprise a moisture blocker, if desired. In this specification, the term "moisture blocker" may mean a material which has free or low reactivity with moisture, but can block or hinder movement of moisture or humidity within the film. As the moisture blocker, for example, one or two or more of clay, talc, needle-like silica, plate-like silica, porous silica, zeolite, titania or zirconia can be used. In addition, the moisture blocker can be surface-treated with an organic modifier or the like to facilitate penetration of organic substances. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof, and the like can be used.

The content of the moisture blocker is not particularly limited and may be suitably selected in consideration of the desired blocking characteristics.

In addition to the above-described constitutions, the encapsulation layer may comprise various additives depending on applications and the manufacturing process of the encapsulation film to be described below. For example, the encapsulation layer may comprise a curable material, a cross-linking agent, a filler or the like in an appropriate range of content depending on the intended physical properties.

In an embodiment of the present invention, the encapsulation layer may be formed in a single layer structure, and may be also formed of two or more layers. For example, if it comprises two layers, each of first and second layers may or may not comprise a moisture adsorbent. In one example, a layer that comprises no moisture adsorbent may be attached to the whole surface of the organic electronic element as described below so as to be in contact with the element.

The laminating order of the first layer and the second layer that is additionally laminated is not particularly limited, and the second layer may be formed on the first layer, and conversely, the first layer may be formed on the second layer. Also, the encapsulation layer may be composed of three or more layers, and for example, the first layer may be included as two or more layers, or the second layer may be included as two or more layers.

The present application also relates to an encapsulation film. The encapsulation film may comprise the above-mentioned metal layer and an encapsulation layer formed on the metal layer and comprising a moisture adsorbent. The encapsulation film may have a specular reflectance R, according to Equation 1 below to the encapsulation layer formed on the metal layer at a wavelength of 550 nm, of 6.5 or less.

$$R = SCI - SCE, \quad \text{(Equation 1)}$$

in Equation 1 above, SCI is a total reflectance (Specular Component Included, SCI) including normal reflection measured according to ASTM E1164-12E1, and SCE means a reflectance (Specular Component Excluded, SCE) excluding normal reflection measured according to ASTM E1164-12E1.

The present application can provide a highly reliable film as a moisture barrier film by controlling the specular reflectance of the encapsulation film to 6.5 or less. The present application can achieve convenience of the process by providing the metal layer and the encapsulation layer integrally, and simultaneously provide a highly reliable film by measuring the specular reflectance as in Equation 1.

The present application also relates to an organic electronic device. As shown in FIG. 2, the organic electronic device (3) may comprise a substrate (31); an organic electronic element (32) formed on the substrate (31); and an encapsulation film (33, 34) for sealing the organic electronic element (32). Here, the encapsulation film may encapsulate, for example, all the top and side surfaces of the organic electronic element. The encapsulation film may comprise an encapsulation layer (33) comprising a pressure-sensitive adhesive composition or an adhesive composition in a cross-linked state. Furthermore, the organic electronic device may be formed such that the encapsulation layer (33) is in contact with the whole surface of the organic electronic element.

Here, the organic electronic element may be, for example, an organic light emitting element.

The present invention also relates to a method of manufacturing an organic electronic device. The organic electronic device can be manufactured using, for example, the encapsulation film.

The encapsulation layer (33) can be formed as a structural encapsulation layer (33) that efficiently fixes and supports the substrate (31) and the metal layer (34), while exhibiting excellent moisture barrier properties and optical characteristics in an organic electronic device.

In addition, the encapsulation layer may be formed as a stable encapsulation layer regardless of the form of the organic electronic device such as top emission or bottom emission.

In this specification, the term encapsulation layer may mean a pressure-sensitive adhesive covering all the top and side surfaces of the organic electronic element.

In order to manufacture the organic electronic device, for example, the method may comprise steps of applying the above-described encapsulation film to a substrate, on which an organic electronic element is formed, to cover said organic electronic element; and curing said encapsulation film. The curing step of the encapsulation film means cross-linking or curing of the encapsulation layer. Here, the application of the encapsulation film may be applied such that the encapsulation layer encapsulates the organic electronic element entirely.

In this specification, the term "curing" may mean that the pressure-sensitive adhesive composition of the present invention forms a cross-linked structure through heating or UV irradiation process, and the like and is produced in the form of a pressure-sensitive adhesive. Alternatively, it may mean that the adhesive composition is produced in the form of an adhesive.

Specifically, the organic electronic element may be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film is placed to cover the whole surface of the organic electronic element of the substrate subjected to the above process.

Effects of the Invention

The present invention provides an encapsulation film that a structure capable of effectively blocking moisture or oxygen introduced from the outside to an organic electronic device can be formed and reliability can be predicted before being applied to the organic electronic device, and a reliability evaluation method for the encapsulation film.

BRIEF DESCRIPTION OF THE DRAWINGS

FIG. 1 is a cross-sectional view showing an encapsulation film according to one example of the present invention.

FIG. 2 is a cross-sectional view showing an organic electronic device according to one example of the present invention.

FIG. 3 is a view showing a reflectance measuring method according to one example of the present invention.

DESCRIPTION OF REFERENCE NUMERALS

1: encapsulation film
11, 33: encapsulation layer
12, 34: metal layer
3: organic electronic device,
31: substrate
32: organic electronic element

DETAILED DESCRIPTION OF THE INVENTION

Hereinafter, the present application will be described in detail with reference to Examples and Comparative Examples, but the scope of the present application is not limited by Examples as set forth below.

Example 1

Preparation of Encapsulation Layer Solution

In toluene containing 0.3 wt % of a dispersant, CaO (particle diameter of about 1 µm) as a moisture adsorbent was dispersed at 50 wt % to prepare 20 g of a dispersion. 50 g of butyl rubber (BR068, EXXON) as an encapsulation resin, 24 g of a hydrogenated hydrocarbon resin (Eastotac H-100L) as a tackifier, 15 g of 2-(2-ethoxyethoxy)ethyl acrylate as a monofunctional acrylate, 10 g of trimethylolpropane triacrylate as a multifunctional active energy ray polymerizable compound and 1 g of 2,2-dimethoxy-1,2-diphenylethane-1-one (Irgacure 651, Ciba) as a radical initiator were introduced into a mixing vessel, diluted with toluene to a solid content of about 15 wt %, and then mixed with the dispersion to prepare a final coating solution such that the moisture adsorbent was in an amount of 20 parts by weight relative to 100 parts by weight of the encapsulation resin.

Production of Encapsulation Film

The prepared encapsulation layer solution was coated on the release surface of a release PET and dried in an oven at 100° C. for 15 minutes to form an encapsulation layer having a thickness of 50 µm, and this layer was laminated with the aluminum film to produce an encapsulation film. Physical properties are measured for a sample irradiating the produced film with ultraviolet at 2 J/cm$^2$. The reflectance is measured with the release PET removed.

Example 2

An encapsulation film was prepared in the same manner as in Example 1, except that the moisture adsorbent content in the encapsulation layer was increased by 1.5 times on the basis of weight as compared with Example 1.

Example 3

An encapsulation film was prepared in the same manner as in Example 1, except that the moisture adsorbent content in the encapsulation layer was increased by two times on the basis of weight as compared with Example 1.

Example 4

An encapsulation film was prepared in the same manner as in Example 1, except that the moisture adsorbent content in the encapsulation layer was increased by three times on the basis of weight as compared with Example 1.

Example 5

The encapsulation film prepared in Example 2 was exposed at a temperature of 25° C. and a relative humidity of 50% for 8 hours.

Comparative Example 1

An encapsulation film was prepared in the same manner as in Example 1, except that no moisture adsorbent was added.

Comparative Example 2

An encapsulation film was prepared in the same manner as in Example 1, except that the moisture adsorbent content in the encapsulation layer was reduced by ½ times on the basis of weight as compared with Example 1.

Comparative Example 3

The encapsulation film prepared in Example 2 was exposed at a temperature of 25° C. and a relative humidity of 50% for 24 hours.

Experimental Example 1—Measurement of Reflectance R

The release PET of the encapsulation film prepared in Examples and Comparative Examples was removed, and the specular reflectance according to Equation 1 below was measured by irradiating the encapsulation layer with light having a wavelength of 550 nm. Specifically, SCI and SCE are measured according to ASTM E1164-12E1 using CM2006d from Konika Minolta (measuring conditions: a set value of M/I+E, a set value of UV 100%, D65 light source, an observing visual field of 10°). Here, a white calibration of the measuring equipment is carried out before starting the measurement. After placing the sample encapsulation film on a flat surface, the measurement is carried out by closely contacting the opening of the measuring instrument to the sample. The measurement is carried out 5 times per sample with changing measuring positions to adopt the average value.

$$R = SCI - SCE \quad \text{(Equation 1)}$$

Experimental Example 2—Evaluation of Element Stability

After removing the release PET of the encapsulation film prepared in Examples and Comparative Examples and applying the encapsulation layer of the encapsulation film to an organic electronic element having a 6 mm bezel to cover the element, the element was exposed at a temperature of 85° C. and a relative humidity of 85% for 850 hours to test the element stability. The results were classified into "pass" when the element deterioration did not progress and "bad" when the element deterioration progressed.

TABLE 1

| | SCI | SCE | R | Element Stability |
|---|---|---|---|---|
| Example 1 | 40.13 | 34.28 | 5.85 | pass |
| Example 2 | 39.86 | 34.15 | 5.71 | pass |
| Example 3 | 38.35 | 32.76 | 5.59 | pass |
| Example 4 | 37.81 | 32.42 | 5.39 | pass |
| Example 5 | 40.05 | 34.24 | 5.81 | pass |
| Comparative Example 1 | 52.03 | 20.52 | 31.51 | bad |
| Comparative Example 2 | 45.69 | 38.52 | 7.17 | bad |
| Comparative Example 3 | 43.37 | 36.75 | 6.62 | bad |

The invention claimed is:

1. A method of evaluating reliability of an encapsulation film comprising:
   providing an encapsulation film which comprises a metal layer, and an encapsulation layer formed on the metal layer and comprising a moisture adsorbent,
   measuring a specular reflectance R of the encapsulation layer at a wavelength of 550 nm, and
   determining the reliability of the encapsulation film by the measured value of the specular reflectance R of the encapsulation layer,
   wherein the reliability of the encapsulation film is determined as excellent provided that the specular reflectance R satisfies the range of 6.5 or less,
   wherein the specular reflectance R is represented by the following Equation 1:

$$R = SCI - SCE \quad \text{(Equation 1)}$$

wherein the Equation 1, SCI is a total reflectance including normal reflection measured according to ASTM E1164-12E1, and SCE is a reflectance excluding normal reflection measured according to ASTM E1164-12E1.

2. The method according to claim 1, wherein the encapsulation layer has a thickness in a range of 15 μm to 70 μm.

3. The method according to claim 1, wherein the metal layer has a thickness in a range of 20 μm to 150 μm.

4. The method according to claim 1, wherein the encapsulation layer comprises an encapsulation resin, and said encapsulation resin comprises an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin or a mixture thereof.

5. The method according to claim 4, wherein the encapsulation resin has a refractive index in a range of 1.3 to 1.6.

6. The method according to claim 1, wherein the moisture adsorbent is a moisture-reactive adsorbent.

7. The method according to claim 1, wherein the moisture adsorbent has an average diameter in a range of 0.5 μm to 5 μm.

8. The method according to claim 1, wherein the moisture adsorbent has a refractive index in a range of 1.6 to 2.5.

9. The method according to claim 4, wherein the moisture adsorbent is comprised in an amount of 5 to 100 parts by weight, relative to 100 parts by weight of the encapsulation resin.

10. The method according to claim 1, wherein the moisture adsorbent is one or more selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

11. The method according to claim 1, wherein the metal layer has a total reflectance SCI including normal reflection measured according to ASTM E1164-12E1 in a range of 50% to 80%.

12. The method according to claim 1, wherein the metal layer has a reflectance SCE excluding normal reflection measured according to ASTM E1164-12E1 in a range of 5% to 35%.

13. The method according to claim 1, wherein the metal layer comprises any one of a metal, a metal oxide, a metal nitride, a metal carbide, a metal oxynitride, a metal oxyboride, and a combination thereof.

14. The method according to claim 1, wherein the metal layer comprises any one of aluminum, copper, nickel, silicon oxide, aluminum oxide, titanium oxide, indium oxide, tin oxide, indium tin oxide, tantalum oxide, zirconium oxide, niobium oxide, and a combination thereof.

15. An encapsulation film comprising a metal layer, and an encapsulation layer formed on said metal layer and comprising a moisture adsorbent, and having a specular reflectance R, according to Equation 1 below to the encapsulation layer formed on said metal layer at a wavelength of 550 nm, of 6.5 or less:

$$R = SCI - SCE \qquad \text{(Equation 1)}$$

wherein the Equation 1, SCI is a total reflectance including normal reflection measured according to ASTM E1164-12E1, and SCE is a reflectance excluding normal reflection measured according to ASTM E1164-12E1.

16. An organic electronic device comprising a substrate; an organic electronic element formed on the substrate; and the encapsulation film according to claim 15 for encapsulating said organic electronic element.

17. A method of manufacturing an organic electronic device comprising steps of applying the encapsulation film according to claim 15 to a substrate, on which an organic electronic element is formed, to cover said organic electronic element; and curing said encapsulation film.

* * * * *